US008562275B2

(12) United States Patent
Hiroki (10) Patent No.: US 8,562,275 B2
(45) Date of Patent: Oct. 22, 2013

(54) TRANSFER DEVICE AND SEMICONDUCTOR PROCESSING SYSTEM (75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/448,071

(22) Filed: Apr. 16, 2012

(65) Prior Publication Data

US 2012/0201634 A1 Aug. 9, 2012

Related U.S. Application Data (62) Division of application No. 10/545,312, filed as application No. PCT/JP2004/002004 on Feb. 20, 2004, now abandoned.

(30) Foreign Application Priority Data

Feb. 24, 2003 (JP) ................................. 2003-045848

(51) Int. Cl.
C23C 16/00 (2006.01)
C23F 1/00 (2006.01)
H01L 21/306 (2006.01)
B65H 1/00 (2006.01)

(52) U.S. Cl.
USPC ............ 414/222.09; 414/222.01; 414/222.13; 414/935; 414/939; 118/719; 156/345.31; 156/345.32

(58) Field of Classification Search
USPC .......... 118/719; 156/345.31, 345.32; 414/935
See application file for complete search history.

(56) References Cited

U.S. PATENT DOCUMENTS

| 5,571,325 A | 11/1996 | Ueyama et al. |
| 5,626,456 A * | 5/1997 | Nishi ............................ 414/404 |
| 6,062,798 A | 5/2000 | Muka |
| 6,091,498 A * | 7/2000 | Hanson et al. ................ 356/623 |
| 6,234,738 B1 | 5/2001 | Kimata et al. |
| 6,533,530 B1 * | 3/2003 | Zenpo ........................ 414/744.5 |
| 6,533,531 B1 * | 3/2003 | Nguyen et al. ............. 414/751.1 |
| 6,742,977 B1 | 6/2004 | Okayama et al. |
| 2005/0010320 A1 | 1/2005 | Ueno et al. |

FOREIGN PATENT DOCUMENTS

| JP | 63-29811 | 2/1988 |
| JP | 6-69315 | 3/1994 |
| JP | 6-349931 | 12/1994 |
| JP | 7-50334 | 2/1995 |
| JP | 07050334 A * | 2/1995 |
| JP | 7-75926 | 3/1995 |
| JP | 8-119409 | 5/1996 |
| JP | 10150090 A | 6/1998 |

(Continued)

Primary Examiner — Karla Moore
(74) Attorney, Agent, or Firm — Rothwell, Figg, Ernst & Manbeck, P.C.

(57) ABSTRACT

A transfer device 17 in a semiconductor processing system includes first and second actuation mechanisms 9A, 9B having first and second support sections movable on first and second vertical planes, respectively, the latter being parallel with each other. First and second movable blocks 18A, 18B are supported on the first and second support sections so that they may be horizontally moved by the first and second actuation mechanisms. Disposed on the first and second movable blocks are first and second handling mechanism 19A, 19B capable of extension and contraction for handling a processing subject substrate W. A control section 20 controls the operation of the first and second actuation mechanisms so that the first and second movable blocks may not interfere with each other.

8 Claims, 9 Drawing Sheets

(56) References Cited

FOREIGN PATENT DOCUMENTS

| | | |
|---|---|---|
| JP | 2000-195925 A | 7/2000 |
| JP | 2000-306978 | 11/2000 |
| JP | 2000-323554 | 11/2000 |
| JP | 2001-93791 | 4/2001 |
| JP | 2002-93715 | 3/2002 |

\* cited by examiner

TRANSFER DEVICE AND SEMICONDUCTOR PROCESSING SYSTEM

CROSS REFERENCE TO RELATED APPLICATIONS

This application is a divisional application of U.S. Ser. No. 10/545,312, filed Aug. 12, 2005, the entire contents of which is incorporated herein by reference. U.S. Ser. No. 10/545,312 is a National Stage of PCT/JP04/02004, filed Feb. 20, 2004, and claims the benefit of priority under 35 U.S.C. §119 from Japanese Patent Application No. 2003-045848, filed Feb. 24, 2003.

FIELD OF THE INVENTION

The present invention relates to a transfer device for use in a semiconductor processing system for transferring a substrate to be processed and a semiconductor processing system having the transfer device. The term "semiconductor processing" used herein denotes various processes performed to manufacture semiconductor devices or a structure including, e.g., wiring and electrodes connected to the semiconductor devices, on a substrate to be processed such as a wafer or a glass substrate for LCD (Liquid crystal display) or FPD (Flat Panel Display), by way of forming a semiconductor layer, an insulating layer, a conductive layer and the like in required patterns on the substrate.

BACKGROUND OF THE INVENTION

A single wafer processing apparatus, which processes substrates one by one, is one of systems for performing a semiconductor processing on a substrate to be processed such as a semiconductor wafer. Further, there is a multi chamber type semiconductor processing system, wherein a plurality of such processing apparatuses are coupled to each other via a common transfer chamber such that various processes can be successively executed without exposing a wafer to the atmosphere. Such a semiconductor processing system may include a normal pressure processing type as disclosed in Japanese Patent Laid-open Publication No. 7-86375 and a vacuum processing type as disclosed in Japanese Patent Laid-open Publication No. 2000-195925.

In the system disclosed in Japanese Patent Laid-open Publication No. 7-86375, a plurality of processing chambers are disposed in a line, and at least some of the processing chambers are disposed vertically. A transfer device movable parallel to the processing chambers is disposed in order to transfer a substrate thereto. The transfer device includes a moving base movable on rails. Stood on the moving base is a pair of supports, which is connected to a vertically movable housing via a vertical arm mechanism. Provided in the housing is a horizontal arm mechanism having a substrate supporting unit capable of supporting two substrates.

In the system disclosed in Japanese Patent Laid-open Publication No. 2000-195925, a transfer chamber capable of being depressurized is surrounded by a plurality of vacuum processing chambers and load lock chambers. Processing chambers and load lock chambers are disposed vertically at least one location around the transfer chamber. A transfer device is disposed in the transfer chamber and includes a pair of small-sized arm mechanisms stretchable and contractable horizontally. The small-sized arm mechanisms are disposed such that they can revolve horizontally and move up and down.

Both systems described above are equipped with two substrate supporting units or two small-sized arm mechanisms, but their transfer efficiencies are not no satisfactory.

SUMMARY OF THE INVENTION

It is, therefore, an object of the present invention to provide a transfer device and a semiconductor processing system capable of improving transfer efficiency.

In accordance with a first aspect of the present invention, there is provided a transfer device for use in a semiconductor processing system, including a first and a second actuation mechanism having a first and a second support section which are respectively movable in a common space on a first and a second vertical plane parallel with each other; a first and a second movable block supported by the first and the second support section so as to be moved while being maintained horizontally in the common space by the first and the second actuation mechanism, wherein the first and the second movable block are extended from the first and the second supporting unit toward the second and the first vertical plane, respectively, by passing through a vertical plane which is at a center between the first and the second vertical plane; a first and a second handling mechanism respectively disposed on the first and the second movable block and capable of being extended and contracted to handle substrates to be processed; and a controller for controlling operations of the first and the second actuation mechanism such that the first and the second movable block do not interfere with each other in the common space.

In accordance with a second aspect of the present invention, there is provided a semiconductor processing system, including a transfer chamber having a plurality of ports for loading or unloading a substrate to be processed; at least one processing chamber, each processing chamber being connected to one of the plurality of ports, for performing a semiconductor processing on the substrate to be processed; and a transfer device, disposed in the transfer chamber, for loading or unloading the substrate to be processed via the plurality of ports, the transfer device having a first and a second actuation mechanism having a first and a second support section which are respectively movable in a common space on a first and a second vertical plane parallel with each other; a first and a second movable block supported by the first and the second support section so as to be moved while being maintained horizontally in the common space by the first and the second actuation mechanism, wherein the first and the second movable block are extended from the first and the second supporting unit toward the second and the first vertical plane, respectively, by passing through a vertical plane which is at a center between the first and the second vertical plane; a first and a second handling mechanism respectively disposed on the first and the second movable block and capable of being extended and contracted to handle substrates to be processed; and a controller for controlling operations of the first and the second actuation mechanism such that the first and the second movable block do not interfere with each other in the common space.

DETAILED DESCRIPTION OF THE PREFERRED EMBODIMENTS

Preferred embodiments of the present invention will now be described with reference to accompanying drawings, in which like reference numerals designate like parts having substantially identical functions and configurations and repeated description thereof will be made only when necessary.

Figure 1:
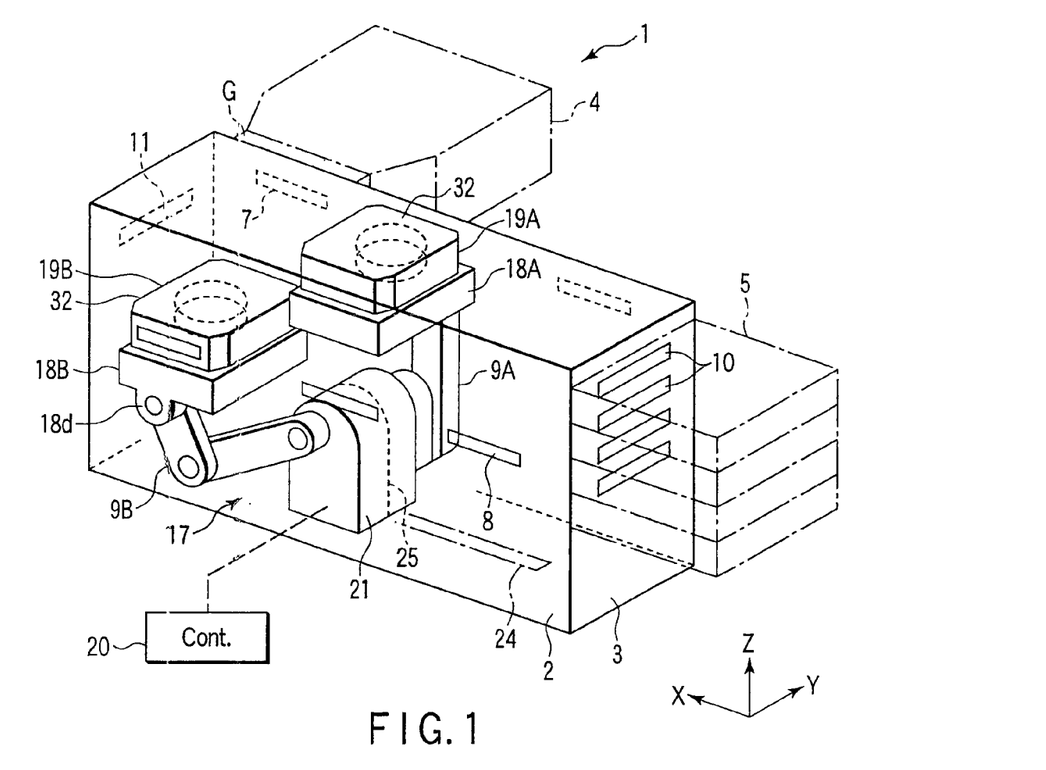
FIG. 1 provides a perspective view for showing a portion of a semiconductor processing system having a transfer device in accordance with a preferred embodiment of the present invention.
Figure 2:
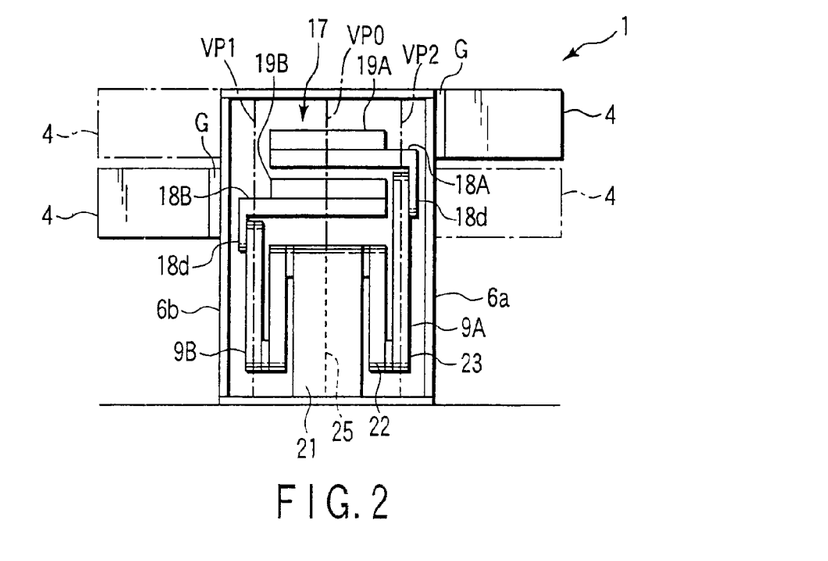
FIG. 2 illustrates a vertical cross sectional side view of the system depicted in FIG. 1.

FIG. 1 provides a perspective view for showing a portion of a semiconductor processing system having a transfer device in accordance with a preferred embodiment of the present invention. FIG. 2 illustrates a vertical cross sectional side view of the system depicted in FIG. 1 and FIG. 3 describes a schematic plan view showing the whole system depicted in FIG. 1.

A semiconductor processing system 1 includes a common transfer chamber (referred to as a vacuum transfer chamber hereinafter) 3 which is formed of a housing 2 extending in a horizontal X direction (a left-right direction in FIG. 3) and can be set to have a depressurized atmosphere therein. Disposed on four side surfaces of the vacuum transfer chamber 3 are a plurality (including different types) of processing chambers (vacuum processing chambers) 4 and load lock chambers 5 capable of being depressurized. The vacuum transfer chambers and/or the load lock chambers 5 are vertically disposed at multiple levels at least one location around the vacuum transfer chamber 3.

Formed on the four side surfaces of the transfer chamber 3 for the respective chambers 4 and 5 are ports 7, 8, 10 and 11 for transferring a semiconductor wafer W functioning as a substrate to be processed. Thus, the ports are arranged vertically at a portion where the vacuum processing chambers 4 and/or the load lock chambers 5 are disposed at multiple levels. Respectively disposed at ports 7, 8, 10 and 11 are gate valves G for airtightly making partitions between the transfer chamber 3, and the vacuum processing chambers 4 and the load lock chambers 5.

Specifically, a multiplicity of, e.g., three, ports 7 is formed at a first height on a side surface (a first side surface) 6a of the vacuum transfer chamber 3. The vacuum processing chamber 4 is connected to each port 7 via a gate valve G. Further, a multiplicity of, e.g., three, ports 8 is formed at a second height on another side surface (a second side surface) 6b opposite to the first side surface 6a. The vacuum processing chamber 4 is also connected to each port 8 via a gate valve G.

Depicted by solid lines in FIG. 2 is a state where the vacuum processing chambers 4 on the first side surface 6a of the vacuum transfer chamber 3 and those on the second side surface 6b thereof are disposed at different heights (i.e., the corresponding ports are provided at different heights). As will be described later, the difference between the first height and the second height corresponds to the height difference between positions of movable blocks 18A and 18B when the positions are exchanged in a Z direction (a vertical direction), wherein the movable blocks 18A and 18B are supported by a first and a second large-sized arm mechanism 9A and 9B and have small-sized arm mechanisms 19A and 19B, respectively. By exchanging the positions in the vertical direction, the movable block 18A can be positioned either above or below the movable block 18B.

In other words, two transfer units are movably disposed in a length direction (the X direction) corresponding to the first and the second height in the housing 2. Accordingly, transfer efficiency can be improved and control can be facilitated. Further, the vacuum transfer chambers 4 may not be necessarily disposed at different heights on the left and the right side surface of the vacuum transfer chamber 3. For example, as depicted by solid lines and imaginary lines in FIG. 2, the vacuum processing chambers 4 can be disposed vertically at two levels on the left side surface and also at the same levels on the right side surface.

Plural, e.g., four, ports 10 are formed vertically at multiple levels (plural levels) on one end of the vacuum transfer chamber 3, i.e., a front end surface (a third side surface adjoining the first side surface) 6c. A load lock chamber 5 is connected to each port 10 via a gate valve G. A port 11 is formed at the first height on the other end of the vacuum transfer chamber 3, i.e., a rear end surface 6d. The vacuum processing chamber 4 is connected to the port 11 via a gate valve G.

The semiconductor processing system 1 also includes an inlet side transfer chamber having a normal pressure atmosphere therein (also referred to as a normal pressure transfer chamber or an atmospheric transfer chamber) 13. The normal pressure transfer chamber is formed of a housing 12 extended in a horizontal Y direction (an up-and-down direction in FIG. 3) running perpendicular to the X direction, and is connected to the vacuum transfer chamber 3 via the load lock chambers 5. The normal pressure transfer chamber 13 is used for transferring the semiconductor wafers W between the air side and the vacuum transfer chamber 3.

Thus, plural, e.g., four, ports for loading and unloading the wafers W are arranged horizontally on one side surface (a front surface) of the normal pressure transfer chamber 13. Connected to each port is a load port device 15 for mounting thereon a cassette 14 accommodating a number of wafers. Four ports are arranged vertically on another side surface (a back surface) of the normal pressure transfer chamber 13 and the above-mentioned load lock chambers 5 are connected thereto via gate valves G. Further, disposed at one end of the normal pressure transfer chamber 13 is an orienter 16 for performing a position aligning of the wafer.

A transfer device 17 is disposed in each of the vacuum transfer chamber 3 and the normal pressure transfer chamber 13. The transfer device 17 in the vacuum transfer chamber 3 and the normal pressure transfer chamber 13 are substantially identical. Therefore, only the transfer device 17 in the vacuum transfer chamber 3 will be described hereinafter, and a description for the transfer device 17 in the normal pressure transfer chamber 13 will be omitted.

The transfer device 17 has a first and a second large-sized arm mechanism (a first and a second actuation mechanism) 9A and 9B, one on the right and one on the left, each formed of a stretchable, contractable and revolvable vertical multi-joint type robot. The first and the second large-sized arm mechanism 9A and 9B respectively have a first and a second support section (leading ends of the first and the second large-sized arm mechanism 9A and 9B in this embodiment). The support sections are respectively movable on a first and a second vertical plane VP1 and VP2 (see FIG. 2) running parallel to the X direction and parallel with each other in a common space formed by the vacuum transfer chamber 3.

Respectively supported at the leading ends of the first and the second large-sized arm mechanism 9A and 9B are a first and a second movable block (a first and a second base portion) 18A and 18B, which are moved horizontally by the first and the second large-sized arm mechanism 9A and 9B. The first and the second movable block 18A and 18B are extended toward each other from the leading ends of the first and the second large-sized arm mechanism 9A and 9B, respectively. The leading ends of the first and the second movable block 18A and 18B pass through a vertical plane VP0 (a central line of the vacuum transfer chamber 3), which is at a center between the first and the second vertical plane VP1 and VP2 (vertical planes on which the leading ends of the first and the second large-sized arm mechanism 9A and 9B are moved), and terminate at positions not reaching the second and the first vertical plane VP2 and VP1, respectively.

A first and a second small-sized arm mechanism (a first and a second handling mechanism) 19A and 19B, which are stretchable and contractable, are disposed on the first and the second movable block 18A and 18B, respectively. The first and the second small-sized arm mechanism 19A and 19B directly handle the wafers W when loading and unloading the wafers W, i.e., substrates to be processed, to and from the vacuum processing chambers 4 and the load lock chambers 5. The first and the second small-sized arm mechanism 19A and 19B can rotate on a horizontal plane, and rotation centers thereof are disposed on the vertical plane VP0 (the center line of the vacuum transfer chamber 3), which is at a center of the first and the second vertical plane VP1 and VP2.

The transfer device 17 further has a control section (controller) 20 for controlling an operation thereof. The control section 20 controls operations of the first and the second large-sized arm mechanism 9A and 9B such that the first and the second movable block 18A and 18B do not interfere with each other in the common space formed by the vacuum transfer chamber 3. That is, the control section 20 manipulates the first and the second movable block 18A and 18B and to exchange their positions vertically.

In this embodiment, the large-sized arm mechanism is employed to move the movable blocks 18A and 18B in the Z direction (vertical direction) and the X direction. The large-sized arm mechanisms 9A and 9B are similar to a transfer robot on the market (UTM-3500 Robot sold by Assist Japan Co., Ltd.), but different therefrom in that two large-sized arm mechanisms 9A and 9B are assembled such that two movable blocks 18A and 18B are overlapped vertically and back and forth.

The first and the second large-sized arm mechanism 9A and 9B share a base (a base portion) 21 disposed on a floor of the vacuum transfer chamber 3. Each of the first and the second large-sized arm mechanism 9A and 9B has a base side arm 22 which is vertically revolvably connected to the base 21 and an intermediate arm 23 which is vertically revolvably connected to a leading end of the base side arm 22. A leading end of each intermediate arm 23 functions as a support section of the movable block and a vertically standing portion 18d formed as a single unit with the movable block 18A or 18B is vertically revolvably connected thereto.

When the large-sized arm mechanisms 9A and 9B cannot cover the whole vacuum transfer chamber 3 due to its extensive length in the forward and backward direction, it is possible to make the base 21 movable in the X direction. In this case, as depicted by imaginary lines in FIG. 1, rails 24 can be prepared on the floor of the vacuum transfer chamber 3 to enable the base 21 to be driven on the rails 24 by a linear motor.

Further, each of the first and the second large-sized arm mechanism 9A and 9B may be configured to have an individual base instead of the common base 21. For example, at a position of a dashed line 25 at the center, the base 21 can be divided into two parts on the right and the left for the large-sized arm mechanisms 9A and 9B as shown in FIG. 1, and the two parts can be made to move independently on the their own rails 24. Consequently, wafers W can be transferred with a higher degree of freedom.

Figure 4:
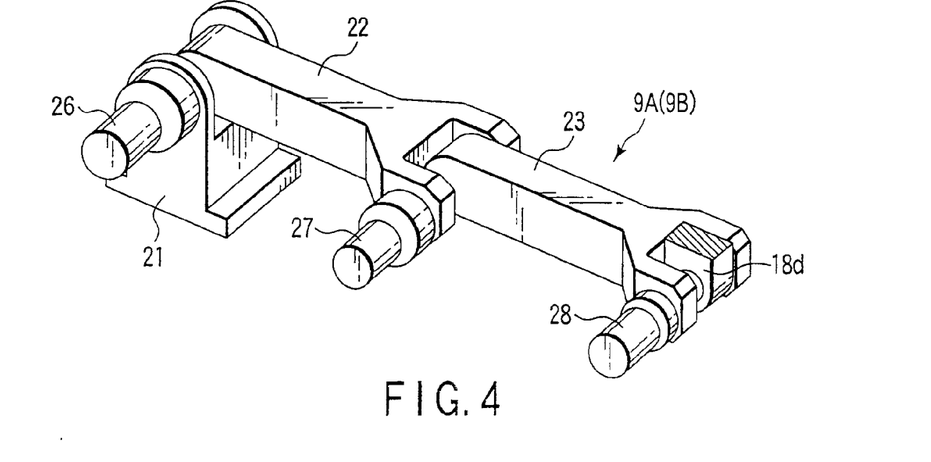
FIG. 4 offers a perspective view showing one example of a large-sized arm mechanism of the transfer device depicted in FIG. 1.

FIG. 4 offers a perspective view showing an exemplary large-sized arm mechanism of the transfer device depicted in FIG. 1. The large-sized arm mechanism 9A (9B) has an individual base 21. At the base 21, a first driving unit 26 for vertically revolvably operating the base side arm 22 is disposed. At a leading end of the base side arm 22, a second driving unit 27 for vertically revolvably driving the intermediate arm 23 is disposed. Disposed at a leading end of the intermediate arm 23 is a third driving unit 28 for vertically revolvably driving the movable block 18A. By stretching, contracting and revolving the large-sized arm mechanism 9A on the vertical plane, the movable block 18A can be moved in the Z direction (vertical direction) and the X direction while being maintained horizontally.

Figure 5:
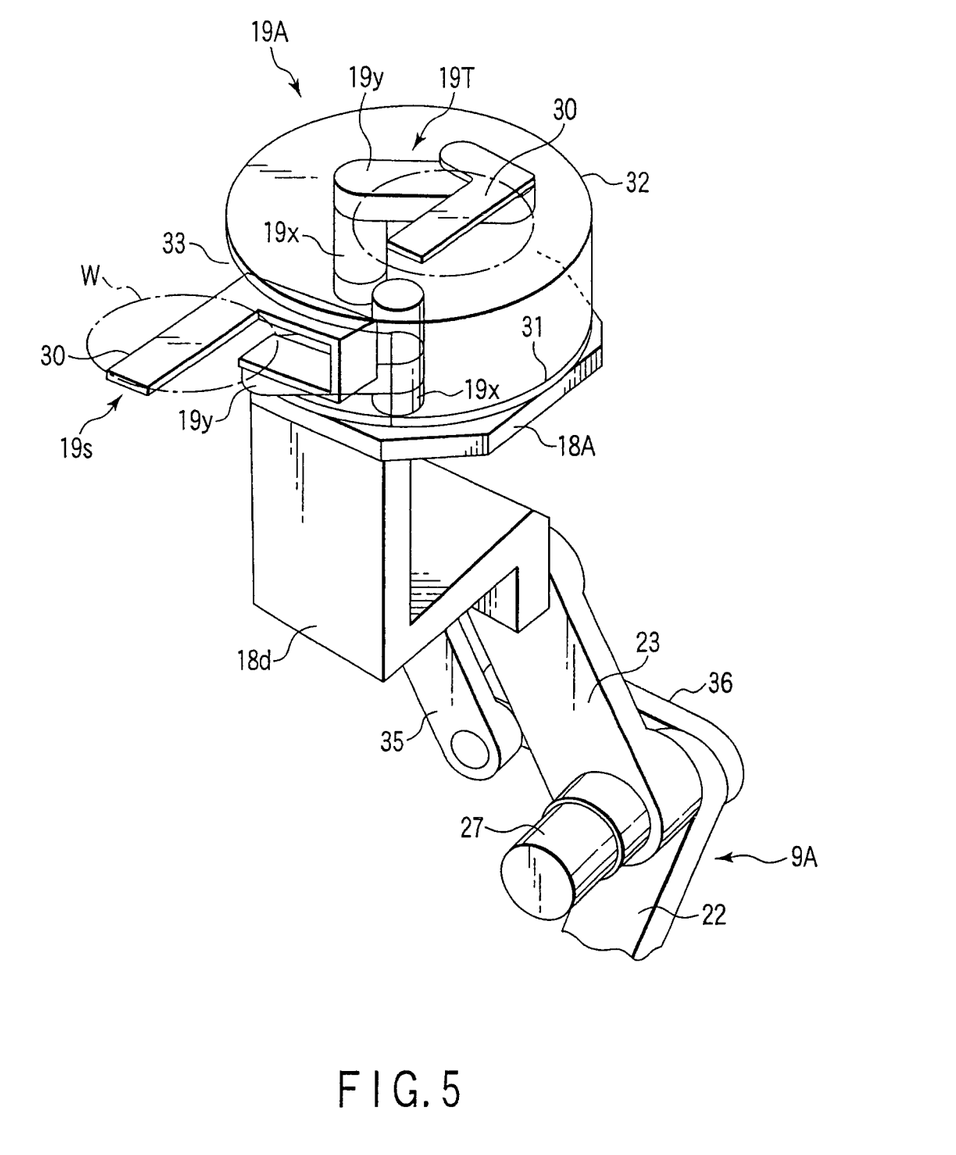
FIG. 5 presents a perspective view showing one example of a small-sized arm mechanism of the transfer device depicted in FIG. 1.

FIG. 5 presents a perspective view showing an exemplary small-sized arm mechanism of the transfer device depicted in FIG. 1. The small-sized arm mechanisms 19A (19B) has a rotatable table 31 which is rotatably disposed on the movable block 18A. Two multi-joint arms 19S and 19T are disposed on the rotatable table 31. Each of the multi-joint arms 19S and 19T has a horizontally revolvable base side arm 19x; an intermediate arm 19y which is horizontally revolvably connected to a leading end of the base side arm 19x; and a pick (a substrate supporting unit) 30 which is horizontally revolvably connected to a leading end of the intermediate arm 19y.

Preferably, a cover 32 is disposed on the rotatable table 31 is to accommodate thereunder the multi-joint arms 19S and 19T when they are contracted. The cover 32 can protect wafers W from particles even in a case where the particles fall down when the positions of the movable blocks 18A and 18B are exchanged vertically. An opening 33 is provided at the cover 32 so that the multi-joint arms 19S and 19T can stretch and contract horizontally. The opening 33 may be provided with a shutter.

An analogue of the multi-joint arms 19S and 19T is disclosed in Japanese Patent Laid-open Application No. 6-338554. In the present embodiment, two multi-joint arms 19S and 19T are mounted on one movable block 18A (18B) in order to exchange a processed wafer and an unprocessed wafer efficiently. However, only one multi-joint arm can be disposed on one movable block 18A (18B).

Figure 6:
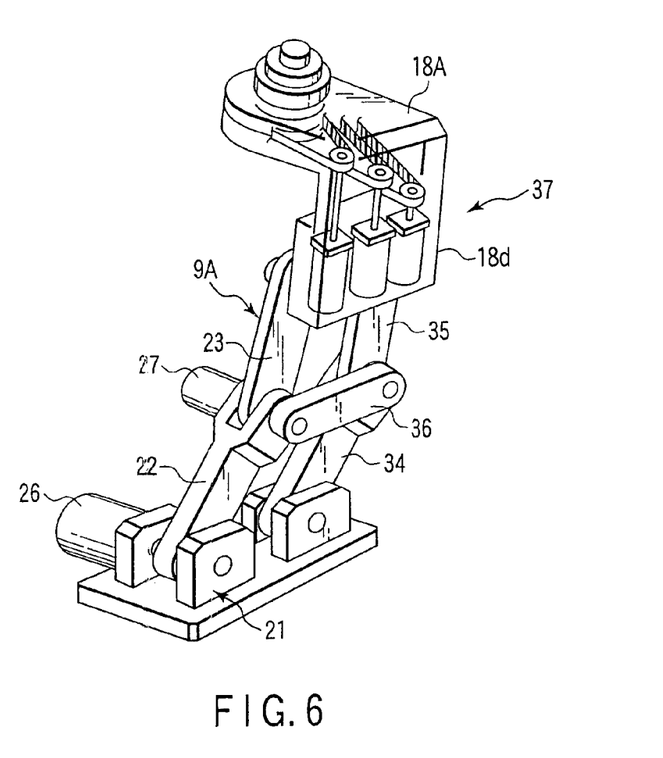
FIG. 6 sets forth a perspective view showing another example of the large-sized arm mechanism of the transfer device depicted in FIG. 1.

FIG. 6 sets forth a perspective view showing another exemplary large-sized arm mechanism of the transfer device depicted in FIG. 1. The large-sized arm mechanism 9A (9B) has a parallel link structure. That is, the large-sized arm mechanism 9A (9B) has a base 21; a pair of base side arms 22 and 34 vertically revolvably connected thereto; and a pair of intermediate arms 23 and 35 vertically revolvably connected to leading ends of the pair of base side arms 22 and 34. The leading ends of the pair of base side arms 22 and 34 are coupled to each other by a link 36. Leading ends of the pair of intermediate arms 23 and 35 function as support sections of the movable block, and the vertically standing portion 18d are formed as a single unit with the movable block 18A (18B) is vertically revolvably connected thereto. In this structure, the third driving unit 28 (see FIG. 4) for horizontally controlling the movable block 18A (18B) becomes unnecessary since the movable block 18A (18B) is translated while being maintained horizontally.

In the structure shown in FIG. 6, a driving unit 37 for a small-sized arm mechanism 19 is preferably disposed at the vertically standing portion 18d of the movable block 18A (18B). By doing so, a thickness of the movable block 18A (18B) can be made thinner, so that a space efficiency can be improved in the transfer space inside the vacuum transfer chamber 3. It is preferable to arrange a harness of electric wires and cables for the driving units 26, 27, 28 and 37 through hollow portions formed at rotation axes of the driving units 26, 27 and 28, the arms 22 and 23, or the like, not at the outside thereof.

Figure 3:
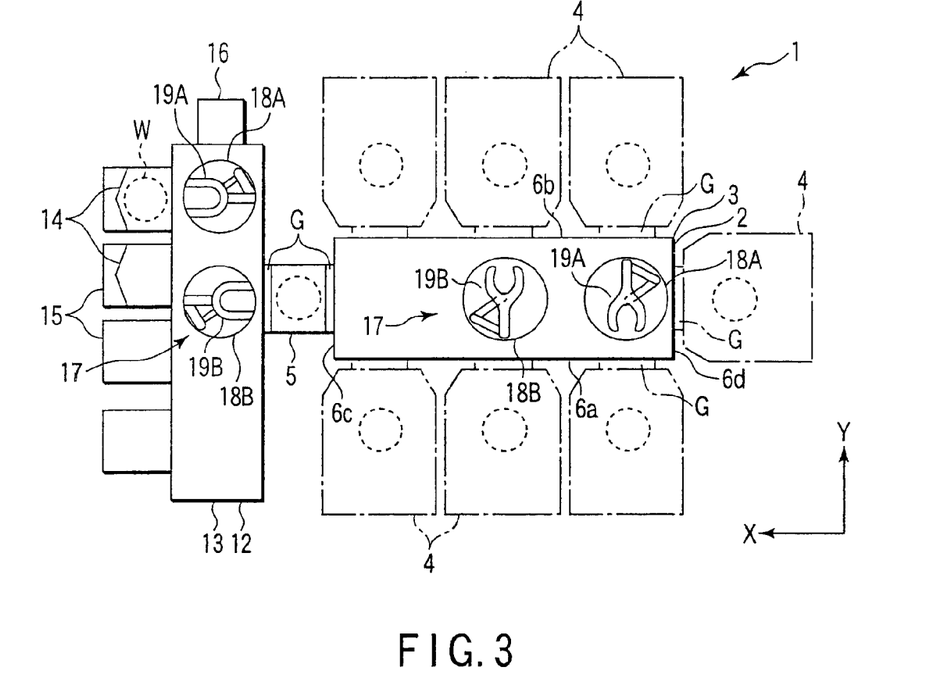
FIG. 3 describes a schematic plan view of the overall system depicted in FIG. 1.

Hereinafter, there will be described an operation of the semiconductor processing system 1 shown in FIG. 3 in a case where the vacuum processing chambers 4 are disposed at different heights at both sides of the vacuum transfer chambers 3 as described above.

First, an unprocessed wafer W is unloaded from a cassette 14 mounted on a load port device 15 and then loaded in one of the load lock chambers 5 by using the transfer device 17 disposed in the normal pressure transfer chamber 13. Particularly, the wafer W is handled by either one of two multi-joint arms 19S and 19T disposed in the small-sized arm mechanism 19A (19B) supported by the large-sized arm mechanism 9A (9B). When a processed wafer W is in the load lock chamber 5, the processed wafer W is unloaded by the other one of the multi-joint arms 19S and 19T and then the unprocessed wafer is loaded into the load lock chamber 5.

After adjusting a pressure in the load lock chamber 5, the unprocessed wafer W is unloaded from the load lock chamber 5 and then loaded into one of the vacuum processing chambers 4. At this time, the transfer device 17 disposed in the vacuum transfer chamber 3 is used for the exchange of the processed wafer and the unprocessed wafer in the vacuum processing chamber 4 or the exchange of the unprocessed wafer and the processed wafer in the load lock chamber 5. Since two multi-joint arms 19S and 19T are disposed in the small-sized arm mechanism 19A (19B) supported on the large-sized arm mechanism 9A (9B), an operation of exchanging wafers can be performed quickly by using both of the multi-joint arms 19S and 19T.

Hereinafter, there will be described in detail an operational example of the small-sized arm mechanism 19A (19B) moving in the Z direction and the X direction by the large-sized arm mechanism 9A (9B) in the vacuum transfer chamber 3 shown in FIG. 1.

The small-sized arm mechanism 19A performs a transfer of the wafers W mainly between two upper load lock chambers 5 of the multi-level load lock chambers 5 and the vacuum processing chambers 4 at the first height on the first side surface 6a of the vacuum transfer chamber 3 (a first transfer route). The other small-sized arm mechanism 19B performs a transfer of wafers W mainly between two lower load lock chambers 5 of the multi-level load lock chambers 5 and the vacuum processing chambers 4 at the second height (lower than the first height) on the second side surface 6b of the vacuum transfer chamber 3 (a second transfer route).

When performing the transfer of wafers W across the first and the second transfer route, the small-sized arm mechanisms 19A and 19B on the movable blocks 18A and 18B are moved in the Z and the X direction and at the same time rotated on horizontal planes. At this time, positions of two movable blocks 18A and 18B are exchanged in the Z direction (the vertical direction) if necessary, to prevent them from interfering with each other.

Further, both of the small-sized arm mechanisms 19A and 19B can transfer the wafers W at an upper end side or a lower end side. Moreover, an operational example of the small-sized arm mechanisms 19A and 19B is not limited to the above-mentioned example.

Hereinafter, there will be described an operation of the semiconductor processing system 1 shown in FIG. 3 in case where the vacuum processing chambers 4 are disposed vertically at two levels on both sides of the vacuum transfer chamber 3 as depicted by the imaginary lines in FIG. 2.

In this case, the small-sized arm mechanism 19A performs the transfer of wafers W between upper vacuum processing chambers 4 and upper load lock chambers 5 (the first transfer route). The other small-sized arm mechanism 19B performs the transfer of wafers W between lower vacuum processing chambers 4 and lower load lock chambers 5 (the second transfer route). In such a case, it is not necessary to vertically exchange the positions of the small-sized arm mechanisms 19A and 19B.

Further, when performing a transfer of wafers W between the vacuum processing chambers 4 on the first side surface 6a and the vacuum processing chambers 4 on the second side surface 6b, the small-sized arm mechanism 19A (19B) is revolved and its stretching and contracting directions thereof are changed. And, when performing a transfer of wafers W across the first transfer route (the upper end side) and the second transfer route (the lower end side), each of the small-sized arm mechanisms 19A and 19B is moved vertically and the positions thereof are vertically exchanged, if necessary.

Figure 7:
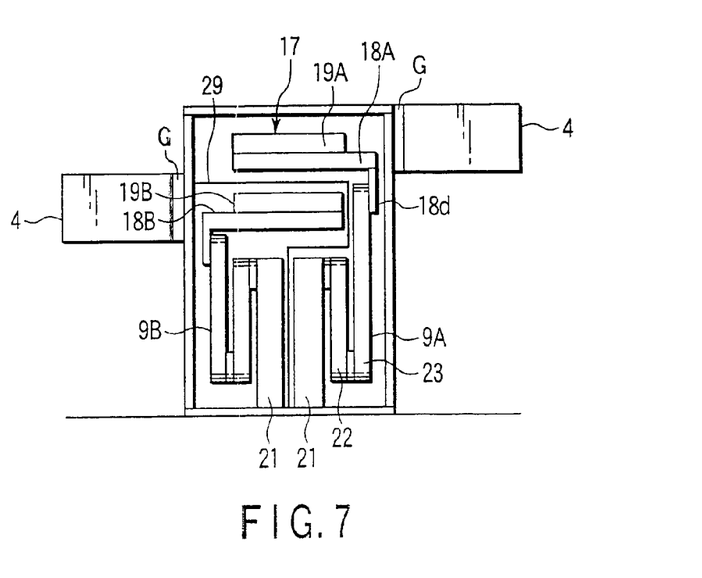
FIG. 7 represents a cross sectional view showing a modified example of the system depicted in FIG. 1.

FIG. 7 represents a cross sectional view showing a modified example of the system depicted in FIG. 1. As described above, the vacuum processing chambers 4 can be disposed at different heights on both sides of the vacuum transfer chamber 3 and the bases 21 can be provided individually on the left and the right for the large-sized arm mechanism 9A and 9B. In this case, a partition plate 29 for partially partitioning the vacuum transfer chamber 3 can be disposed at a position between the ports of the vacuum processing chambers 4 of the first height and the ports of the vacuum processing chambers 4 of the second height, as shown in FIG. 7. By doing so, it is possible to prevent a diffusion of contaminants between the vacuum processing chambers of the first height and those of the second height. Also in this case, the positions of the small-sized arm mechanisms 19A and 19B are vertically exchanged if necessary, when performing a transfer of wafers W between the upper end side and the lower end side.

Figure 8:
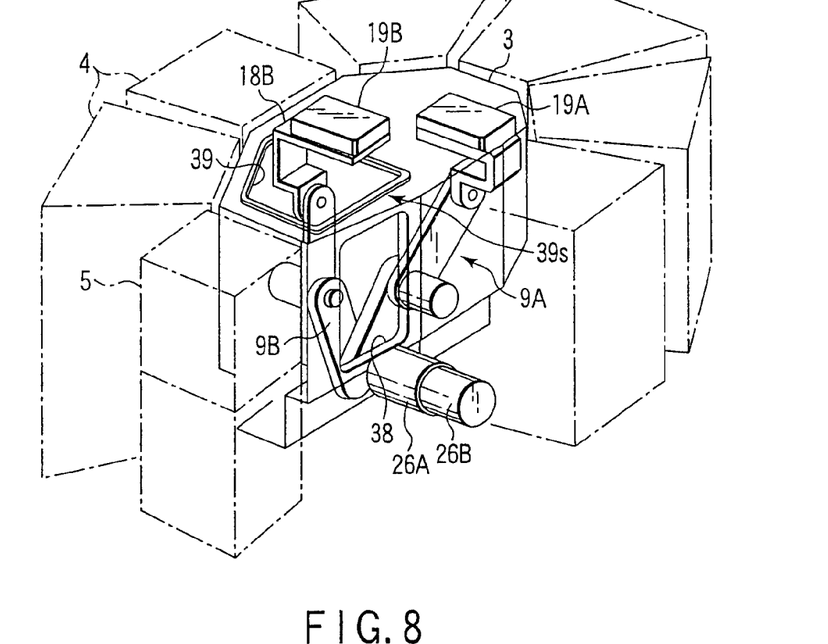
FIG. 8 illustrates a perspective view showing a semiconductor processing system having a transfer device in accordance with another preferred embodiment of the present invention.
Figure 9:
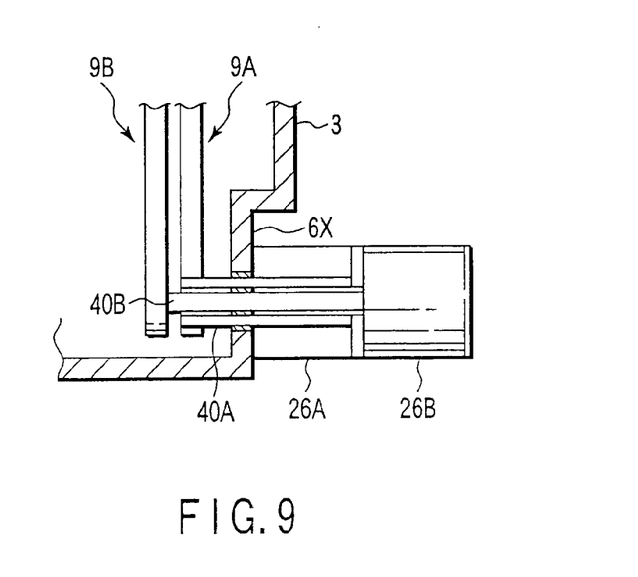
FIG. 9 describes a cross sectional view showing a driving unit of the transfer device depicted in FIG. 8.

FIG. 8 illustrates a perspective view showing a semiconductor processing system having a transfer device in accordance with another preferred embodiment of the present invention. FIG. 9 shows a cross sectional view of driving units of the transfer unit shown in FIG. 8.

In such a semiconductor processing system 1, the transfer device 17 is installed (by being offset) at a position close to one end in a length direction of the vacuum transfer chamber 3 in order to improve maintainability. Namely, a base portion of two large-sized arm mechanisms 9A and 9B is disposed at a position close to one end in the length direction of the vacuum transfer chamber 3, e.g., a position close to a load lock chamber 5. An opening 38, which can be opened or airtightly closed selectively by a maintenance door (not shown), is formed on one side surface (for example, a first side surface) of the vacuum transfer chamber 3.

The semiconductor processing system 1 further has a structure for making use of, at an upper part thereof, an increased stroke obtained by offsetting the base portion of the large-sized arm mechanism 9A (9B). That is, an opening 39, which can be opened or airtightly closed selectively by a lid (not shown), is provided at the upper portion (a ceiling plate) of the vacuum transfer chamber 3. A curtain sensor (an area sensor) 39s is disposed at the opening 39. Further, if the large-sized arm mechanism 9A (9B) is made to have a margin in the stroke thereof, the opening can be employed even in a case where the base portion is not disposed at an offset position in the vacuum transfer chamber 3.

The movable block 18A (18B) can be projected upward from the opening 39 by stretching the large-sized arm mechanism 9A (9B). By projecting the movable block 18A (18B) from the opening 39, it is possible to facilitate maintenance of the movable block 18A (18B) and the small-sized arm mechanism 19A (19B). The curtain sensor 39s serves to give the alarm to operators by detecting their approach to the opening 39 in order to prevent the operators from getting into unintentional contact with the movable block 18A (18B) and the small-sized arm mechanism 19A (19B).

As shown in FIG. 9, the large-sized arm mechanisms 9A and 9B are revolvably supported by a lower sidewall 6x of the vacuum transfer chamber 3 serving as a common fixed base portion. The revolving centers of the large-sized arm mechanisms 9A and 9B are disposed coaxially and, on an outer surface of the lower sidewall 6x, driving units 26A and 26B of the large-sized arm mechanisms 9A and 9B are disposed correspondingly to these axes. By disposing the driving units 26A and 26B outside the vacuum transfer chamber 3, it is possible to remove heat generation units (driving units) from a vacuum atmosphere which cannot readily dissipate the heat and at the same time it is also possible to improve maintainability.

Specifically, the first driving unit 26A of the first large-sized arm mechanism 9A is attached to the lower sidewall 6x. A rotation axis 40A of the first driving unit 26A is airtightly and rotatably inserted into the vacuum transfer chamber 3. The rotation axis 40A of the first driving unit 26A is a hollow axis. The first driving unit 26B of the second large-sized arm mechanism 9B is attached to an outer side of the first driving unit 26A. A rotation axis 40B of the first driving unit 26B is airtightly and rotatably inserted through the inside of the hollow rotation axis 40A.

Figure 10:
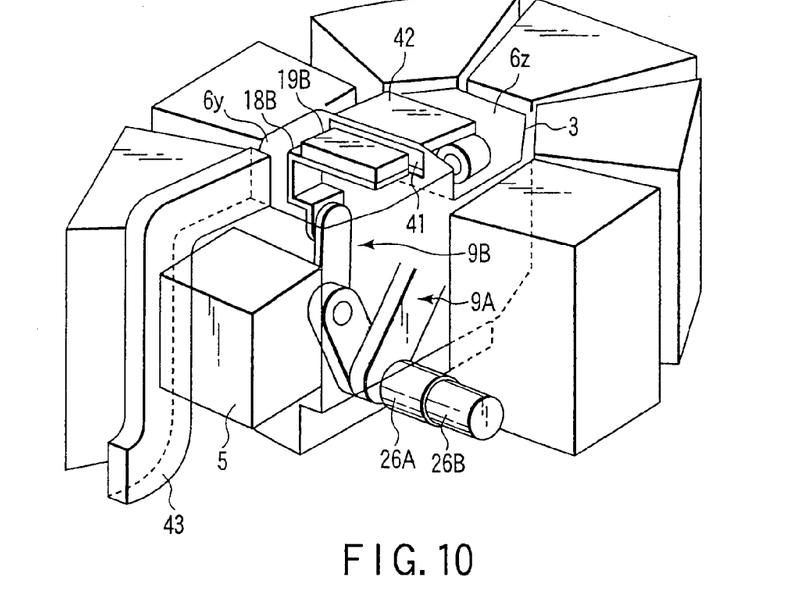
FIG. 10 offers a perspective view showing a modified example of the system depicted in FIG. 8.

FIG. 10 offers a perspective view showing a modified example of the system depicted in FIG. 8. In this modified example, a ceiling portion 6y at one end side of the vacuum transfer chamber 3 is formed higher than a ceiling portion 6z at the other end side thereof. A sub-port 41 for loading and unloading wafers W is formed at an upper sidewall of the boundary between the higher ceiling portion 6y and the lower ceiling portion 6z. Connected to the sub-port 41 via a gate valve (not shown) is a sub-module, for example, a sub-processing chamber 42 for performing a preheating, a cooling or the like of wafer. The sub-processing chamber 42 is disposed on the lower ceiling portion 6z, so that a space can be used effectively. An upper space under the higher ceiling portion 6y is set to have dimensions capable of disposing the small-sized arm mechanism 19A (19B) thereat when the small-sized arm mechanism 19A (19B) accesses the sub-processing chamber 42.

Further, in the semiconductor processing system 1 shown in FIG. 10, a utility duct 43 is disposed by making use of an empty space, so that space efficiency can be improved. The duct 43 is formed of an angled pipe made of plastic or the like, and a bundle of pipes, wires and the like for utilities is inserted through the inside of the duct 43 to be protected. The pipes and wires for utilities include pipes or wires for electricity, water, nonreactive gas (e.g., nitrogen), dry air and the like supplied from a factory to the semiconductor processing system; and pipes for draining water, heat exhaust and the like from the semiconductor processing system to the factory.

Figure 11:
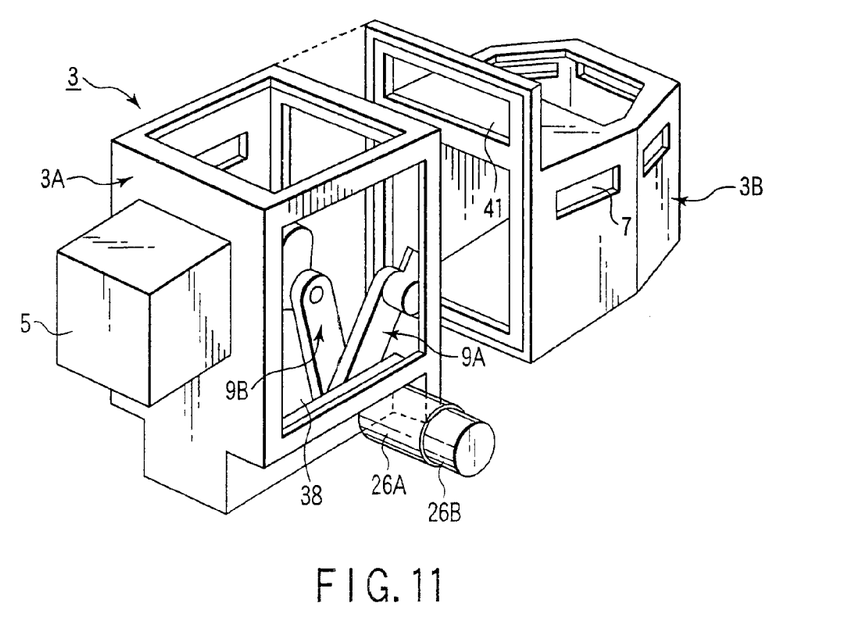
FIG. 11 provides a perspective view showing a modified example of the system depicted in FIG. 10.

FIG. 11 provides a perspective view showing a modified example of the system depicted in FIG. 10. In this modified example, a housing of the vacuum transfer chamber 3 has a configuration capable of being divided into a front portion and a rear portion. As described above, the base portion of the large-sized arm mechanisms 9A and 9B is offset and, thus, disposed at the front end side of the vacuum transfer chamber 3. Accordingly, it becomes possible to divide the housing of the vacuum transfer chamber 3 into a standard portion 3A having the large-sized arm mechanisms 9A and 9B at the front and an optional portion 3B at the back. The optional portion 3B at the back can be selected from those of plural kinds having large and small sizes with varying the number of process modules connected thereto.

Figure 12:
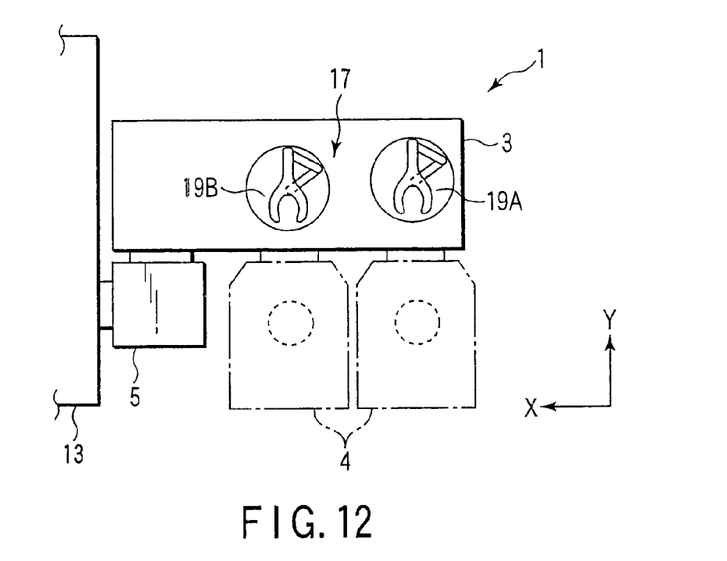
FIG. 12 presents a schematic plan view showing a semiconductor processing system in accordance with another preferred embodiment of the present invention.
Figure 13:
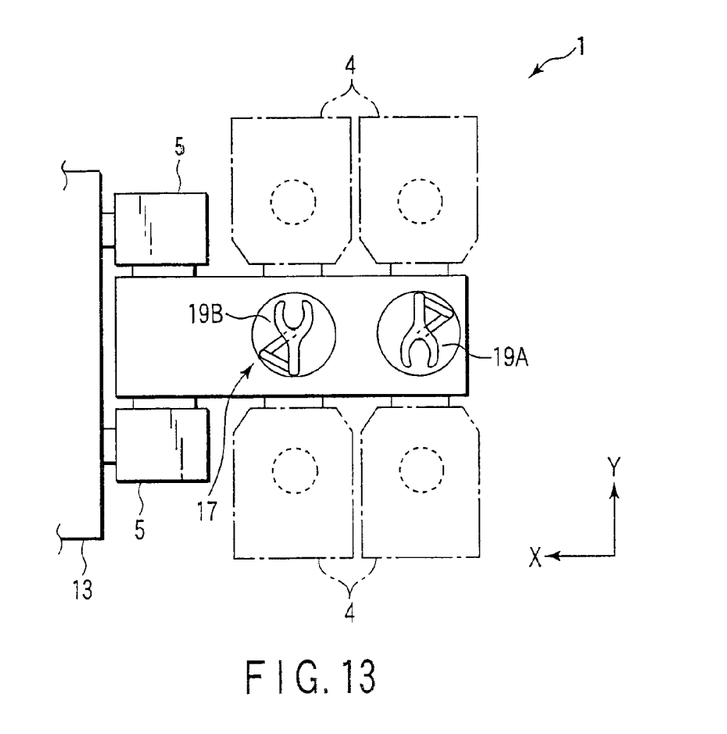
FIG. 13 sets forth a schematic plan view showing a semiconductor processing system in accordance with still another preferred embodiment of the present invention.

FIGS. 12 and 13 present schematic plan views showing semiconductor processing systems in accordance with further preferred embodiments of the present invention. In the embodiments described with reference to FIGS. 1 to 11, the small-sized arm mechanism 19A (19B) is revolvably disposed on the movable block 18A (18B). In contrast, the small-sized arm mechanism 19A (19B) does not make a revolving movement in the embodiments shown in FIGS. 12 and 13. The transfer devices 17 shown in FIGS. 12 and 13 are identical to that shown in FIG. 1 excepting that the small-sized arm mechanism 19A (19B) thereof does not make a revolving movement.

In the embodiment shown in FIG. 12, vacuum processing chambers 4 and load lock chambers 5 are disposed only at one side of a vacuum transfer chamber 3. The vacuum processing chambers 4 and the load lock chambers 5 are disposed at multiple levels at least one location around the vacuum transfer chamber 3. The small-sized arm mechanism 19A (19B) is movable in the X direction, i.e., the length direction of the transfer chamber, and the Z direction by the large-sized arm mechanism 9A (9B) shown in FIG. 1, for example. Further, the small-sized arm mechanism 19A (19B) is stretchable and contractable in the Y direction running perpendicular to the X direction.

As depicted in FIG. 12, both the small-sized arm mechanisms 19A and 19B access the ports of the vacuum processing chambers 4 and the load lock chambers 5 by stretching in a same Y direction. And, the small-sized arm mechanism 19A (19B) performs a transfer of wafers W between the vacuum processing chambers 4 and the load lock chambers 5. Although the transfer device 17 has a structure simpler than that shown in FIG. 1, it is appropriate to a small-sized semiconductor processing system 1 as illustrated in FIG. 12.

In the embodiment shown in FIG. 13, vacuum processing chambers 4 and load lock chambers 5 are disposed at both sides of a vacuum transfer chamber 3. The vacuum processing chambers 4 and the load lock chambers 5 are disposed at multiple levels at least one location of each side of the vacuum transfer chamber 3. The small-sized arm mechanism 19A (19B) is movable in the X direction, i.e., the length direction of the transfer chamber, and the Z direction by the large-sized arm mechanism 9A (9B) shown in FIG. 1, for example. Further, the small-sized arm mechanism 19A (19B) is stretchable and contractable in the Y direction running perpendicular to the X direction.

As depicted in FIG. 13, both of the small-sized arm mechanisms 19A and 19B access the ports of the vacuum processing chambers 4 and the load lock chambers 5 by stretching in opposite Y directions. And, the small-sized arm mechanism 19A (19B) performs a transfer of wafers W between the vacuum processing chambers 4 and the load lock chambers 5 at either one of the sides of the vacuum transfer chamber 3. Although the transfer device 17 has a structure simpler than that shown in FIG. 1, it is appropriate for use in a semiconductor processing system 1 as illustrated in FIG. 13, where a processing sequence for the wafers W is somewhat limited.

Figure 14:
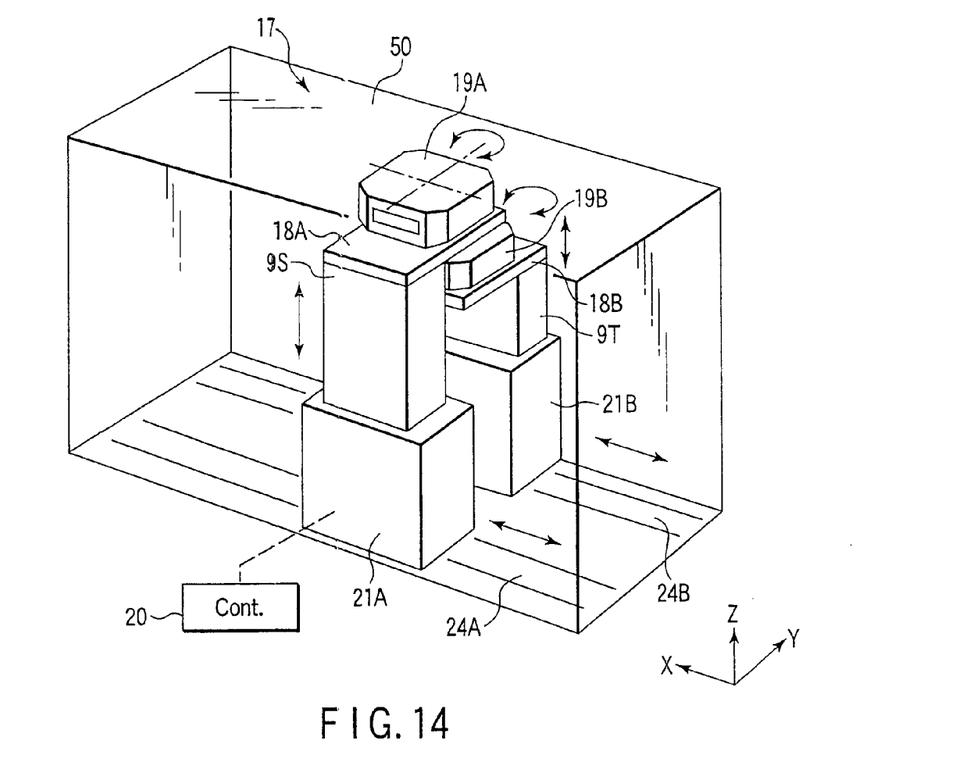
FIG. 14 represents a perspective view showing a transfer device in accordance with still another preferred embodiment of the present invention.

FIG. 14 represents a perspective view showing a transfer device in accordance with another preferred embodiment of the present invention. The transfer device 17 has a first base 21A and a second base 21B independently moving in the X direction on rails 24A and 24B. Respectively disposed on the first and the second base 21A and 21B are a first and a second elevation mechanism (reciprocator) 9S and 9T which slide in the vertical direction (the Z direction). The first and the second elevation mechanism 9S and 9T respectively have a first and a second support section (leading ends of the first and the second elevation mechanism 9S and 9T in this embodiment) moving on a first and a second vertical plane which are parallel to the X direction and also parallel with each other in a common space formed by a transfer chamber (a vacuum transfer chamber or a normal pressure transfer chamber) 50.

A first and a second movable block (a first and a second base portion) 18A and 18B are respectively supported on the leading ends of the first and the second elevation mechanism 9S and 9T and are horizontally moved by the first and the second elevation mechanism 9S and 9T. The first and the second movable block 18A and 18B are respectively extended from the leading ends of the first and the second elevation mechanism 9S and 9T toward each other. The leading ends of the first and the second movable block 18A and 18B pass through a vertical plane (a central line of the vacuum transfer chamber 50), which is at a center between the first and the second vertical plane described above (vertical planes on which the leading ends of first and the second elevation mechanism 9S and 9T are moved), and terminate at a position not reaching the second and the first vertical plane.

A first and a second small-sized arm mechanism (a first and a second handling mechanism) 19A and 19B, which are stretchable and contractable, are disposed on the first and the second movable block 18A and 18B, respectively. The first and the second small-sized arm mechanism 19A and 19B can rotate on horizontal planes, and rotation centers thereof are disposed on the vertical plane (the center line of the vacuum transfer chamber 50), which is at a center of the first and the second vertical plane.

The transfer device 17 further has a control section (a controller) 20 for controlling an operation thereof. The control section 20 controls operations of the first and the second base 21A and 21B and the first and the second elevation mechanism 9S and 9T such that the first and the second movable block 18A and 18B do not interfere with each other in the common space formed by the transfer chamber 50. That is, the control section 20 manipulates the first and the second movable block 18A and 18B such that their positions are exchanged vertically.

Figure 15A:
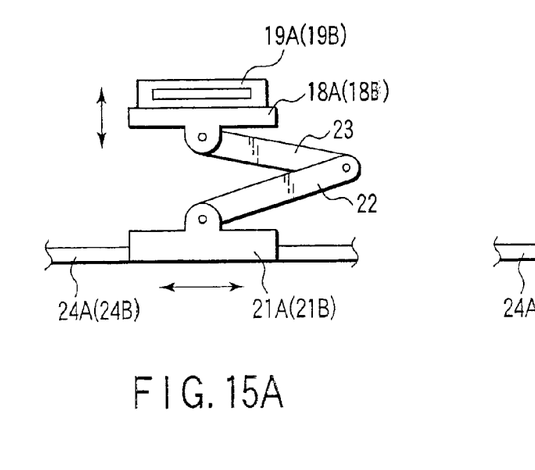
FIGS. 15A and 15B describe schematic side views showing a transfer device in accordance with still another preferred embodiment of the present invention.
Figure 15B:
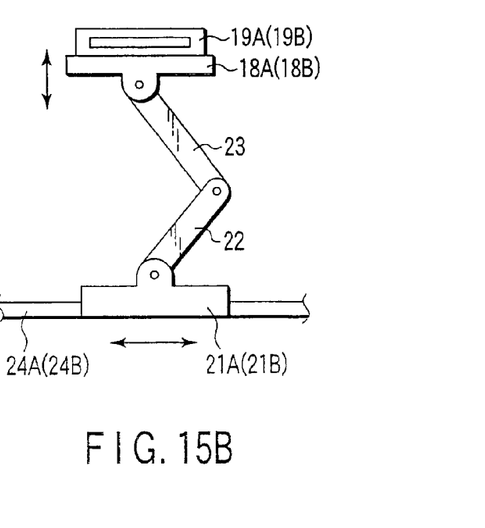

FIGS. 15A and 15B describe schematic side views showing a transfer device in accordance with another preferred embodiment of the present invention. The transfer device employs multi-joint arms instead of the elevation mechanisms 9S and 9T depicted in FIG. 14. FIG. 15A presents a state where the movable block 18A (18B) is moved down; and FIG. 15B presents a state where the movable block 18A (18B) is moved up. Remaining portions of the transfer device can be configured in the same manner shown in FIG. 14.

The transfer device 17 shown in FIGS. 15A and 15B has a base 21A (21B) moving on a rail 24A (24B). A base side arm 22 is vertically revolvably connected to the base 21A (21B). An intermediate arm 23 is vertically revolvably connected to a leading end of the base side arm 22. A movable block 18A (18B) is vertically revolvably connected to a leading end of the intermediate arm 23 while being maintained horizontally. The multi-joint arm stretches and contracts such that the movable block 18A (18B) moves only vertically. Also in this embodiment, the first and the second movable block 18A and 18B are operated so that the positions thereof can be exchanged vertically.

Figure 16:
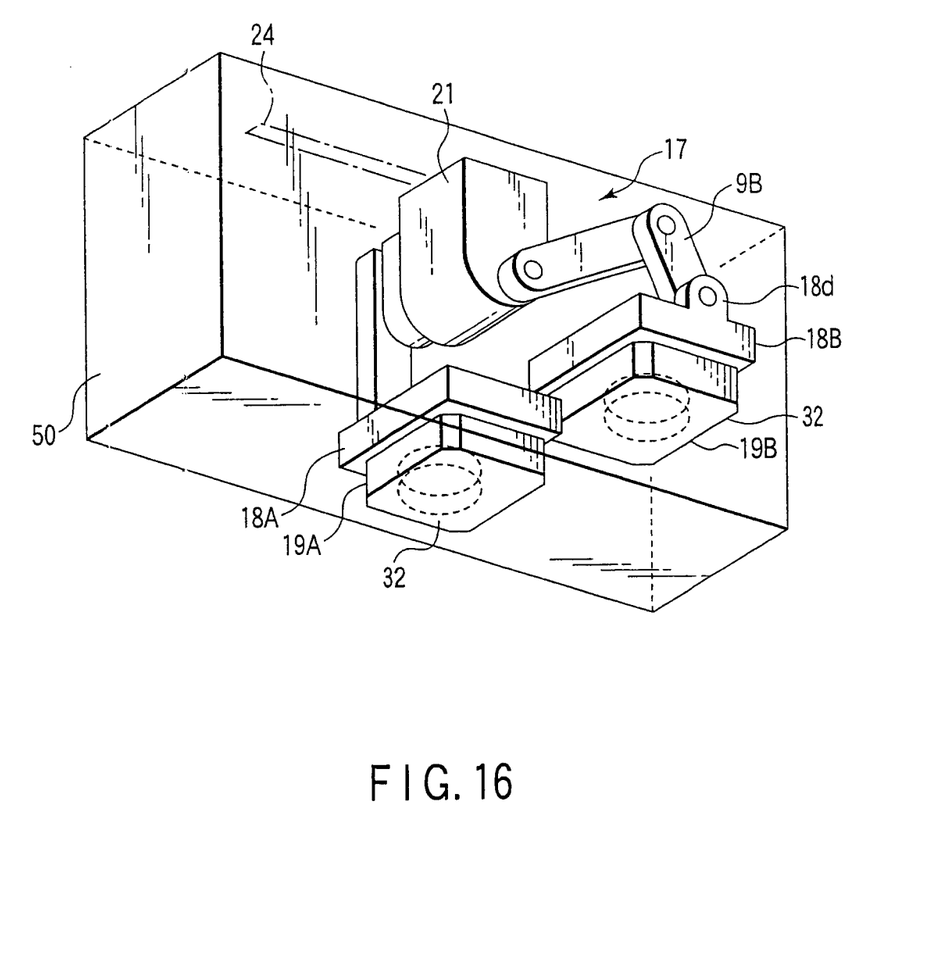
FIG. 16 offers a perspective view showing a transfer device in accordance with still another preferred embodiment of the present invention.

FIG. 16 offers a perspective view showing a transfer device in accordance with still another preferred embodiment of the present invention. In the embodiments described with reference to FIGS. 1 to 15B, the base or the base portion of the transfer device is disposed on or near the floor of the transfer chamber. In the embodiment shown in FIG. 16, however, a base (a base portion) 21 is disposed on a ceiling of a transfer chamber (a vacuum transfer chamber or a normal pressure transfer chamber) 50. The transfer device depicted in FIG. 16 has the same structure as the transfer device 17 shown in FIG. 1 excepting that it is upside down. That is, a first and a second large-sized arm mechanisms 9A and 9B are downwardly disposed on the base 21 to enable downward stretching. Lower end portions of the first and the second large-sized arm mechanisms 9A and 9B function as support sections of movable blocks and movable blocks 18A and 18B are vertically revolvably connected thereto.

Similarly, in case of the transfer device of the type shown in FIG. 8 or the transfer device of the type shown in FIG. 14, the base or the base portion thereof may also be disposed at a ceiling side such that actuation mechanisms of movable blocks stretch downward. Further, if necessary, it is possible to combine an actuation mechanism of a movable block with its base or base portion disposed at a floor side and an actuation mechanism of a movable block with its base or base portion disposed at a ceiling side.

As described above, semiconductor wafers can be transferred reliably and efficiently through the use of the transfer device and the semiconductor processing systems in accordance with preferred embodiments of the present invention. For example, two small-sized arm mechanisms (handling mechanisms) 19A and 19B can be disposed at locations having a same coordinate in the X coordinate but with different coordinates in the Z direction (vertical direction), if necessary. Also in such a case, each of the small-sized arm mechanism 19A and 19B does not interfere with an actuation mechanism of a movable block for the other small-sized arm mechanism. Therefore, a wafer can be transferred reliably and efficiently to a mounting position, resulting in an improved processing throughput. Further, in a structure where two actuation mechanisms of movable blocks have a common base portion, an overall transfer device becomes compact. Thus, space efficiency of a device or a system can be improved.

Further, the present invention is not limited to the illustrated preferred embodiments, and various changes and modifications may be without departing from the spirit and scope of the invention. For example, in addition to a wafer, a LCD substrate can be used as a substrate. Further, a small-sized arm mechanism (a handling mechanism) may be implemented with a plurality of linearly slidable arms in lieu of a multi-joint arm. In this case, by moving each arm forward and backward, it is possible to extend and retract a substrate supporting unit at a leading end thereof.

INDUSTRIAL APPLICABILITY

In accordance with the present invention, a transfer device and a semiconductor processing system capable of improving transfer efficiency are provided.

What is claimed is:

1. A semiconductor processing system, comprising:
a transfer chamber having a first port and a second port for loading or unloading substrates to be processed, the first port being disposed on a first side surface of the transfer chamber, and the second port being disposed on a second side surface different from the first side surface of the transfer chamber;
a first chamber and a second chamber connected to the first port and the second port, respectively, each of the first chamber and the second chamber being a processing chamber or a load lock chamber;
a transfer device, disposed in the transfer chamber, for loading or unloading the substrates to be processed via the first port and the second port,
the transfer device including:
a first actuation mechanism and a second actuation mechanism having a first support section and a second support section, respectively, wherein the first support section and the second support section are movable in a common space on a first vertical plane and a second vertical plane, respectively, and the first vertical plane and the second vertical plane are parallel to each other;
a first movable block and a second movable block respectively supported by the first support section and the second support section so as to be moved while being maintained horizontally in the common space by the first actuation mechanism and the second actuation mechanism, respectively, wherein the first movable block and the second movable block are extended from the first support section and the second support section toward the second vertical plane and the first vertical plane, respectively, and pass through a vertical plane at a center between the first vertical plane and the second vertical plane, and wherein a vertical distance between the first movable block and the second movable block is adjustable;
a first handling mechanism and a second handling mechanism respectively disposed on the first movable block and the second movable block and capable of being extended and contracted to handle substrates to be processed;
a first base and a second base respectively connected to the first actuation mechanism and the second actuation mechanism; and
a controller configured to control the first actuation mechanism and the second actuation mechanism such that the first movable block and the second movable block are vertically adjusted with respect to each other so as to not interfere with each other in the common space,
wherein the first base and the second base are configured to reciprocate in a horizontal direction parallel to the first and the second vertical plane independently with respect to each other,
wherein the first movable block and the second movable block are configured to move up and down independently with respect to each other,
wherein the controller is configured to control the first actuation mechanism or the second actuation mechanism to cause the first movable block to be positioned above or below the second movable block when the first base passes the second base,
wherein each of the first handling mechanism and the second handling mechanism includes at least one handling arm adapted to be extended or contracted horizontally and includes at least one member adapted to rotate the at least one handling arm in a horizontal plane, wherein the handling arm of the first handling mechanism and the handling arm of the second handling mechanism are independently rotatable with respect to each other, and
wherein when the first handling mechanism transfers a substrate to the first chamber via the first port, the second handling mechanism is configured to transfer another substrate to the second chamber via the second port.

2. The semiconductor processing system of claim 1, wherein the first actuation mechanism and the second actuation mechanism are configured to slide respectively from the first base and the second base in a vertical direction parallel to the first vertical plane and the second vertical plane and to move independently with respect to each other.

3. The semiconductor processing system of claim 1, wherein the first actuation mechanism and the second actuation mechanism include a first multi-joint arm and a second multi-joint arm, respectively.

4. The semiconductor processing system of claim 3, wherein the first multi-joint arm and the second multi-joint arm each has:
a side arm vertically revolvable and connected to a corresponding one of the first base or the second base; and
an intermediate arm vertically revolvable and connected to a leading end of a corresponding side arm of the first multi-joint arm or the second multi-joint arm,
wherein each of the side arms and each of the intermediate arms is configured to revolve in a direction parallel to the first vertical plane and second vertical plane.

5. The semiconductor processing system of claim 3, wherein the first multi-joint arm and the second multi-joint arm are configured to stretch and contract such that the first movable block and the second movable block move only in a vertical direction from the first base and the second base, respectively.

6. The transfer device of claim 1, wherein rotation centers of the first handling mechanism and the second handling mechanism are disposed between the first vertical plane and the second vertical plane.

7. The semiconductor processing system of claim 6, wherein the rotation centers of the first handling mechanism and the second handling mechanism are disposed on the vertical plane at the center between the first vertical plane and the second vertical plane.

8. The semiconductor processing system of claim 1, wherein the second side surface is disposed opposite to the first side surface, and wherein the transfer device is disposed between the first side surface and the second side surface.

* * * * *